United States Patent
Guillet et al.

(10) Patent No.: US 11,415,561 B2
(45) Date of Patent: Aug. 16, 2022

(54) METHOD FOR DETECTING A MALFUNCTION OF AN ACOUSTIC SENSOR COUPLED TO AN ELECTROCHEMICAL GENERATOR AND DEVICE IMPLEMENTING SAID METHOD

(71) Applicants: COMMISSARIAT A L'ENERGIE ATOMIQUE ET AUX ENERGIES ALTERNATIVES, Paris (FR); INSTITUT POLYTECHNIQUE DE GRENOBLE, Grenoble (FR)

(72) Inventors: Nicolas Guillet, Pizançon (FR); Mélanie Alias, Poligny (FR); Florence Degret, Malakoff (FR)

(73) Assignees: COMMISSARIAT A L'ENERGIE ATOMIQUE ET AUX ENERGIES ALTERNATIVES, Paris (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 1 day.

(21) Appl. No.: 16/772,564

(22) PCT Filed: Dec. 14, 2018

(86) PCT No.: PCT/EP2018/084928
§ 371 (c)(1),
(2) Date: Jun. 12, 2020

(87) PCT Pub. No.: WO2019/115757
PCT Pub. Date: Jun. 20, 2019

(65) Prior Publication Data
US 2020/0386720 A1 Dec. 10, 2020

(30) Foreign Application Priority Data
Dec. 14, 2017 (FR) ...................... 1762110

(51) Int. Cl.
*G01N 29/44* (2006.01)
*G01N 29/14* (2006.01)
*G01R 31/36* (2020.01)

(52) U.S. Cl.
CPC ......... *G01N 29/4436* (2013.01); *G01N 29/14* (2013.01); *G01R 31/36* (2013.01)

(58) Field of Classification Search
CPC .... G01N 29/4436; G01N 29/14; G01R 31/36; H04R 29/004; H04R 17/00
See application file for complete search history.

(56) References Cited

U.S. PATENT DOCUMENTS

2012/0304771 A1* 12/2012 Yamamoto ............. G01N 29/14
73/587
2017/0199162 A1* 7/2017 Nordstrom ............. G01N 29/30

FOREIGN PATENT DOCUMENTS

| EP | 2 575 205 A1 | 4/2013 |
|---|---|---|
| FR | 3 011 336 A1 | 4/2015 |
| JP | 2010-071945 A | 4/2010 |

OTHER PUBLICATIONS

International Search Report as issued in International Patent Application No. PCT/EP2018/084928, dated Mar. 8, 2019.

\* cited by examiner

*Primary Examiner* — Xin Y Zhong
(74) *Attorney, Agent, or Firm* — Pillsbury Winthrop Shaw Pittman LLP

(57) ABSTRACT

A method for detecting a malfunction of an acoustic sensor coupled to an electrochemical generator includes applying an electrical signal at a given frequency and a given amplitude, termed the signal frequency and signal amplitude; measuring, by the acoustic sensor, an acoustic signal emitted by the electrochemical generator in response to the application of the electrical signal; and, when the amplitude of the (Continued)

acoustic signal is below a predetermined threshold value, and detecting a malfunction of the acoustic sensor.

9 Claims, 4 Drawing Sheets

METHOD FOR DETECTING A MALFUNCTION OF AN ACOUSTIC SENSOR COUPLED TO AN ELECTROCHEMICAL GENERATOR AND DEVICE IMPLEMENTING SAID METHOD

CROSS-REFERENCE TO RELATED APPLICATIONS

This application is the U.S. National Stage of PCT/EP2018/084928, filed Dec. 14, 2018, which in turn claims priority to French patent application number 1762110 filed Dec. 14, 2017. The content of these applications are incorporated herein by reference in their entireties.

TECHNICAL FIELD OF THE INVENTION

The technical field of the invention is that of detecting malfunctions of a sensor. The present invention relates to detecting a malfunction of an acoustic sensor and in particular detecting a malfunction of an acoustic sensor coupled to an electrochemical generator.

TECHNOLOGICAL BACKGROUND OF THE INVENTION

Following the global condition of a battery, and more particularly of an electrochemical generator, has become a major stake in the field of energy management. In order to ensure continuous follow-up for these generators, even when the latter are being used, various techniques have been developed.

One of them that is particular promising, consists of emitting an acoustic signal on a wall of a generator then measuring, for example using an acoustic sensor, the response of the system. It has been shown that such a measurement makes it possible to access information such as the health status or the charge status of the generator. However, such a method requires a functional acoustic sensor.

However, it is difficult to detect the malfunction of a sensor, whether at the time of the calibration of the measuring device or all throughout the life of the latter. Methods such as the "pencil lead break" method (method recommended by the standardisation body ASTM International: ASTM E976-10 and E1106-12), although satisfactory on the scale of a laboratory cannot be used to verify the good coupling of a sensor with an electrochemical generator on an industrial scale. During use, no satisfactory method currently exists. Certainly, it is possible to emit a sound with an acoustic emitter then to measure the response of the acoustic sensor. But this technique does not make is possible to determine whether the malfunction originates from the acoustic emitter or from the acoustic sensor.

There is therefore a need for a method that makes it possible to detect the malfunction of an acoustic sensor coupled to an electrochemical generator not only during the calibration of the latter, but also during the use of the electrochemical generator. There is also a need for a device that makes it possible to implement such a method.

SUMMARY OF THE INVENTION

The invention offers a solution to the problems mentioned hereinabove, by making it possible to detect a malfunction of an acoustic sensor from an electrical signal applied on the terminals of an electrochemical generator to which the acoustic sensor is coupled.

A first aspect of the invention relates to a method for detecting a malfunction of an acoustic sensor coupled to an electrochemical generator GE. The method according to the first aspect of the invention comprises:
- a first step of applying an electrical signal at a given frequency and a given amplitude, termed the signal frequency and signal amplitude, said signal frequency preferably being between 1 kHz and 1 MHz;
- a second step of measuring, by the acoustic sensor, an acoustic signal emitted by the electrochemical generator in response to the application of the electrical signal;
- when the amplitude of the acoustic signal is below a predetermined threshold value, a third step of detecting a malfunction of the acoustic sensor.

Thanks to the invention, it is possible to reliably test the correct operation of an acoustic sensor coupled to an electrochemical generator. The inventors have indeed discovered that, against all expectations, the application of an electrical signal to the terminals of an electrochemical generator could generate an acoustic wave of which the frequency is close to that of the electrical signal used. This acoustic wave can then be used to verify the correct operation or the malfunction of an acoustic sensor.

In addition to the characteristics that have just been mentioned in the preceding paragraph, the method according to a first aspect of the invention can have one or several additional characteristics among the following, taken individually or in any technically possible combinations.

Advantageously, the acoustic sensor has a resonance frequency and the signal frequency is chosen according to said resonance frequency. Thus, greater detection sensitivity is obtained.

Advantageously, the first step of applying an electrical signal and the second step of measuring an acoustic signal are repeated at a given frequency, termed the detection frequency. Thus, the method makes it possible to ensure a follow-up of the proper operation of the acoustic sensor.

Advantageously, the electrical signal is superimposed on the electrical signals corresponding to the normal operation of the electrochemical generator. Thus, the method can be implemented while the electrochemical generator is being used.

Advantageously, the amplitude of the acoustic signal considered is the average value of the amplitude of the acoustic signal measured over a given bandwidth. Thus, the reliability of detecting a malfunction is improved.

Advantageously, the electrical signal applied has a sine, square or triangular shape.

Advantageously, the method according to a first aspect of the invention comprises, before the first step of applying an electrical signal, a step of calibrating during which the threshold value and/or the signal amplitude are determined. Thus, the threshold value and/or the signal amplitude are adapted to the particularities of each system.

A second aspect of the invention relates to a device comprising a means of calculating and an acoustic sensor intended to be coupled to said electrochemical generator, the device being configured to implement the method for detecting according to a first aspect of the invention. Such a device makes it possible to ensure the follow-up of an acoustic sensor.

A third aspect of the invention relates to a computer program comprising instructions which lead the device according to a second aspect of the invention to execute the steps of the method according to a first aspect of the invention.

A fourth aspect of the invention relates to a support that can be read by a computer, on which the computer program is recorded according to a third aspect of the invention.

The invention and the various applications thereof will be understood better when reading the following description and when examining the accompanying figures.

BRIEF DESCRIPTION OF THE FIGURES

The figures are presented for the purposes of information and in no way limit the invention.

DETAILED DESCRIPTION OF AT LEAST ONE EMBODIMENT OF THE INVENTION

Unless mentioned otherwise, the same element that appears on the different figures has a same reference.

Figure 1A:
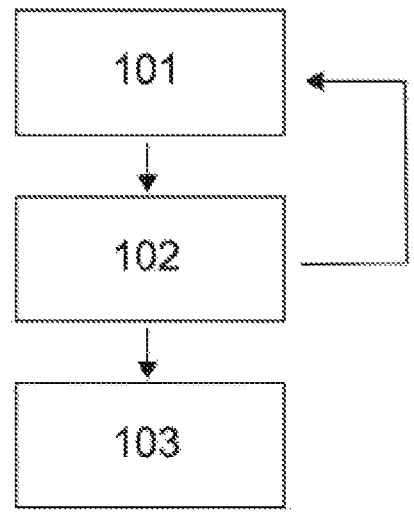
FIG. 1A shows a flowchart of a method according to a first aspect of the invention.
Figure 1B:
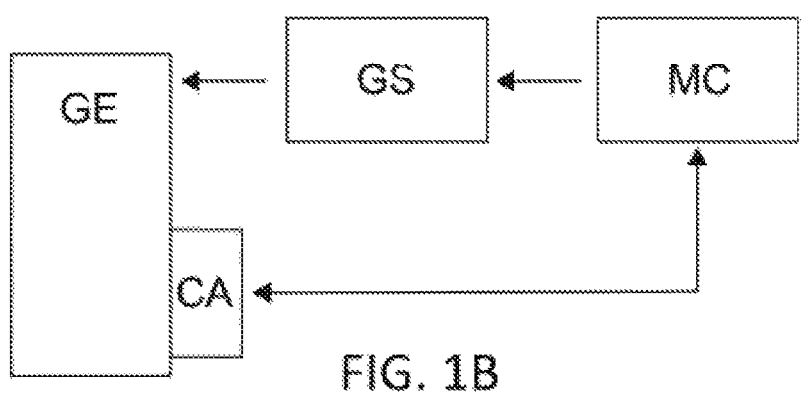
FIG. 1B diagrammatically shows a device according to a second aspect of the invention.
Figures 2A, 2B:
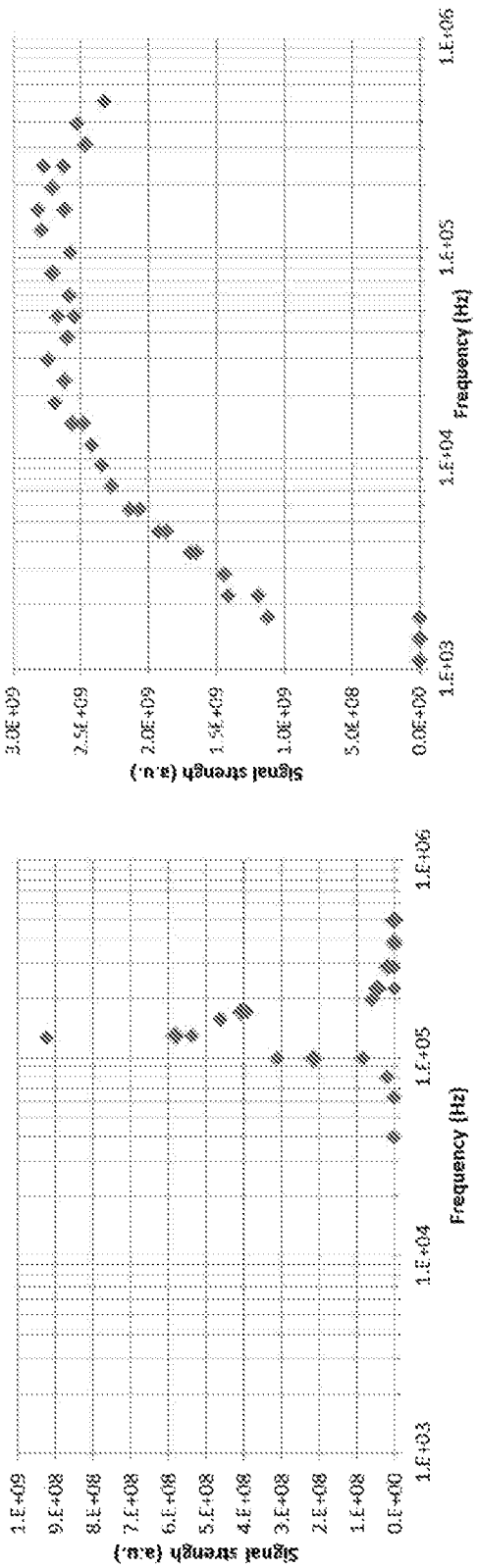
FIG. 2 shows the frequency response of a piezoelectric sensor.

A first aspect of the invention shown in FIG. 1 relates to a method 100 for detecting a malfunction of an acoustic sensor CA coupled to an electrochemical generator GE. The acoustic sensor CA can for example be a piezoelectric sensor, in particular a sensor with a ceramic or piezoelectric polymer base. For example, the acoustic sensor CA can include a piezoelectric made from PZT (lead zirconate titanate $Pb(Zr_x,Ti_{1-x})O_3$) which makes it possible to obtain a sensor that has a narrow resonance (in general between 10 kHz and a few hundred kHz) as shown in FIG. 2A. In another example, the acoustic sensor can include a piezoelectric made of PVDF (polyvinylidene fluoride) which makes it possible to obtain a sensor that has a wide resonance (in general between a few kHz and a few MHz) as shown in FIG. 2B. The coupling between the acoustic sensor CA and the electrochemical generator GE is for example obtained by gluing the sensor CA onto a wall of said generator GE. The electrochemical generator GE can in particular have the form of a battery or of a fuel cell. More generally, the term electrochemical generator GE means a device that makes it possible to convert the chemical energy into electrical energy. The malfunction that the method 100 makes it possible to detect can have several origins. For example, the malfunction can be due to a problem with the sensor CA itself or be due to a total or partial detaching of the sensor CA resulting in a loss of coupling between the sensor CA and the electrochemical generator GE. The malfunction can also relate to a deviation in the performance of the sensor CA.

Figure 3:
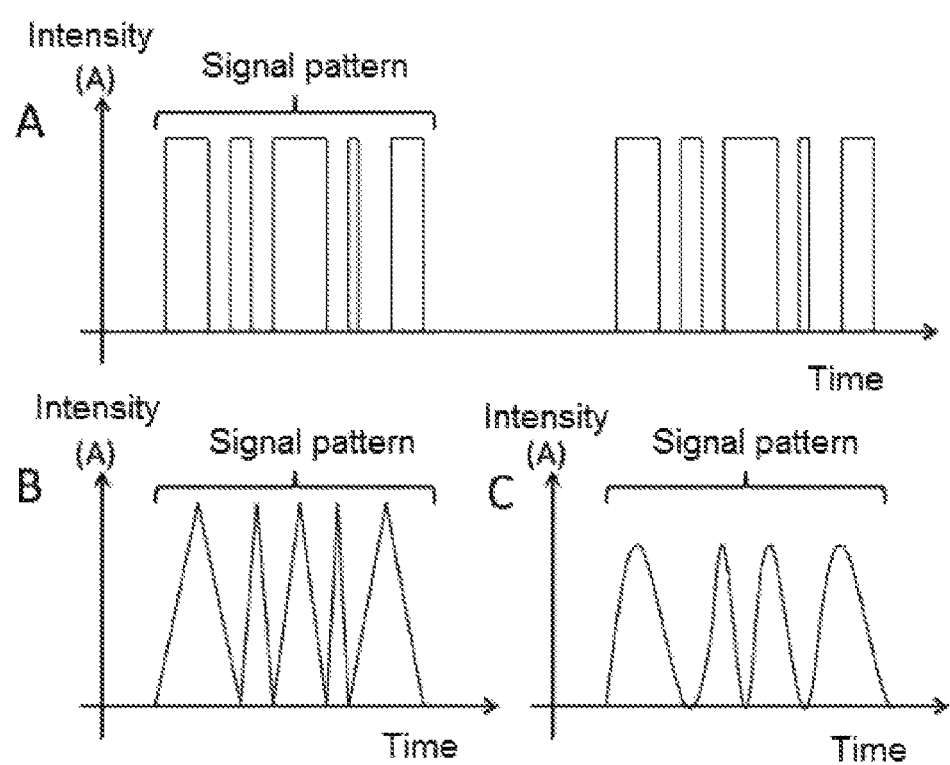
FIG. 3 diagrammatically shows electrical signals in a method according to a first aspect of the invention.

The method 100 according to the invention comprises a first step 101 of applying an electrical signal SE at a given frequency and a given amplitude, termed the signal frequency and signal amplitude, said signal frequency being more preferably comprised between 1 kHz and 1 MHz. The electrical signal SE can consist of a variation in voltage or of a variation in current. The electrical signal SE can be of any shape whatsoever or, as shown in FIG. 3, of square shape (FIG. 3A), triangular (FIG. 3B) or sine (FIG. 3C). The electrical signal SE can be generated by a unit for managing the electrochemical generator GE or by a generator GS of electrical signals SE connected to the terminals of the electrochemical generator GE in addition (for example in parallel) or in place of the unit for managing the electrochemical generator GE. The electrical signal SE can for example be superimposed on the charging or discharging current of the electrochemical generator GE. The characteristics of the electrical signal SE are chosen according to the nature of the electrochemical generator GE (size, nature of the materials, internal structure, etc.) and/or of the acoustic sensor CA. Thus, in the case of a sensor PZT, the signal frequency will preferably be between 100 and 200 kHz, while in the case of a sensor PVDF, the signal frequency will preferably be between 10 kHz and 200 kHz. The amplitude of the electrical signal SE must be chosen in such a way as to generate an acoustic signal SA that can be received by the acoustic sensor CA. This amplitude will therefore in particular depend on the type of electrochemical generator GE, of the sensitivity of the acoustic sensor CA and of the measurement environment (interference noise, etc.).

In an embodiment, the acoustic sensor CA has a resonance frequency and the signal frequency SE is chosen according to said resonance frequency. The resonance frequency can be given by the manufacturer of the sensor CA or measured once the sensor CA is in place on the electrochemical generator GE. In an embodiment, the electrical signal SE takes the form of pulses at a given frequency (for example, a frequency comprised between 1 KHz and 1 MHz) or at a plurality of frequencies. The parameters of the pulses (for example, time separating two pulses and/or frequency or frequencies of the signal) can thus form a signature specific to the pulse in such a way as to be able to optionally make the difference between the acoustic signal SA generated by the electrical signal SE and the other interference acoustic signals. Thus, it is possible to take account only of the acoustic signals SA that have the same signature as the electrical signals SE so as to detect any malfunction of the acoustic sensor CA.

The method 100 according to the invention also comprises a second step 102 of measuring, by the acoustic sensor CA, the acoustic signal SA emitted by the electrochemical generator GE in response to the application of the electrical signal SE. Indeed, the inventors have revealed that, contrary to what is expected, the application of an electrical signal SE on the terminals of an electrochemical generator GE drives the emission of acoustic waves at a close frequency. More particularly, these acoustic waves are generated by low mechanical stresses and the releasing thereof driven by the application of an electrical signal SE at the terminals of the electrochemical generator GE. Thus, the application of an electrical signal SE drives, when there is no malfunction of the acoustic sensor CA, the measurements of an acoustic signal SA by said acoustic sensor CA.

Figure 4:
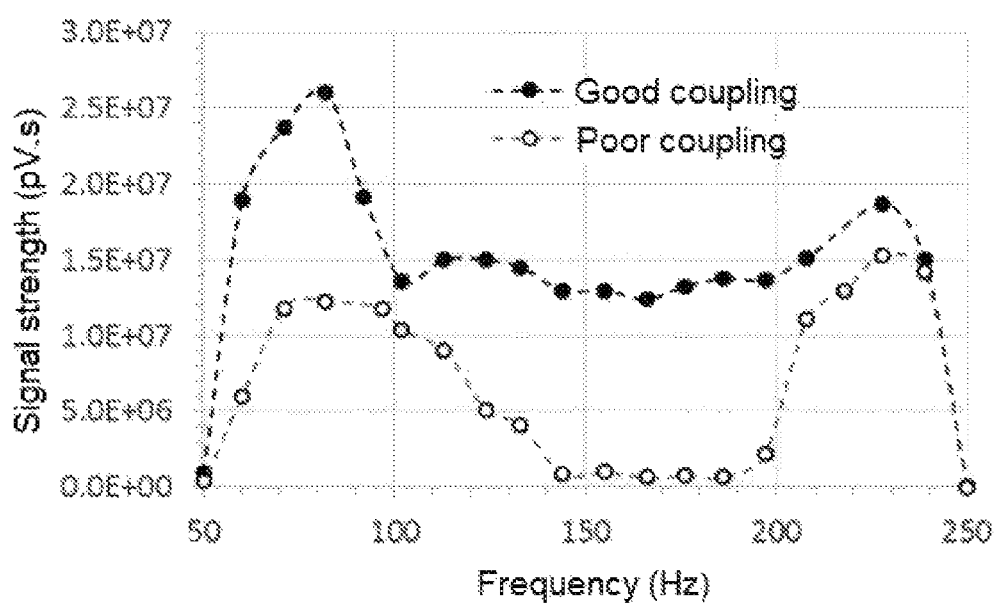
FIG. 4 diagrammatically shows the change in the acoustic signal measured in an embodiment of a method according to a first aspect of the invention.

The method 100 also comprises, when the amplitude of the acoustic signal SA measured is below a predetermined threshold value, a third step 103 of detecting a malfunction of the acoustic sensor CA. In an embodiment, the amplitude of the acoustic signal SA considered is the value of the amplitude measured at a given reference frequency. In an embodiment, the amplitude of the acoustic signal SA considered is the value measured at a particular frequency (for example at the frequency for which the amplitude of the received signal is maximal) or an average value of the acoustic amplitude measured over a given bandwidth (for example, over all or a portion of the frequency range swept by the electrical signal SE). An example of a step of detecting a malfunction is shown in FIG. 4, with the malfunction consisting of a decoupling of the acoustic sensor CA, for example due to a partial detaching of the latter. FIG. 4 shows the strength of the signal SA measured (the strength of the signal is defined as the integral of the amplitude of the signal measured during the duration of the packet waveform; the strength of the signal is independent of the gain and calculated over the entire dynamic range of the signal received) according to the frequency of the signal for a situation in which the coupling between the acoustic sensor CA and the electrochemical generator GE is good and for a situation in which the coupling between the acoustic sensor CA and the electrochemical generator GE is poor. As it appears in this figure, when the acoustic sensor is correctly coupled to the electrochemical generator GE, the acoustic signal SA measured for a given electrical signal SE has a change that is characteristic of the strength of the signal according to the frequency. This curve can in particular be used to calibrate the detection. When the coupling between the acoustic sensor CA and the electrochemical generator GE is deteriorated, the distribution of the strength of the signal according to the frequency of the signal measured by said acoustic sensor CA is modified and the malfunction can be detected. In the example of FIG. 4, the average value of the amplitude of the signal measured between 150 kHz and 200 kHz can be taken as a reference of the amplitude measured. Note that the modification can be progressive (the detaching occurs little by little) or on the contrary occurs suddenly.

When it is desirable to conduct a follow-up on the status of the acoustic sensor CA, in an embodiment, the first step 101 of applying an electrical signal SE and the second step 102 of measuring the acoustic signal SA are repeated at a given frequency, termed the detection frequency. Thus, the status of the acoustic sensor CA is verified at the detection frequency.

A second aspect of the invention shown in FIG. 1A relates to a device DM comprising a means of calculating MC, an acoustic sensor CA intended to be coupled to an electrochemical generator GE, said device being configured to implement the method 100 for detecting according to a first aspect of the invention. The acoustic sensor CA can for example be a piezoelectric sensor, in particular a sensor with a ceramic or piezoelectric polymer base. For example, the acoustic sensor CA can include a piezoelectric made from PZT (lead zirconate titanate) which makes it possible to obtain a sensor that has a narrow resonance (in general between 10 kHz and a few hundred kHz) as shown in FIG. 2A. In another example, the acoustic sensor can include a piezoelectric made of PVDF (polyvinylidene fluoride) which makes it possible to obtain a sensor that has a wide resonance (in general between a few kHz and a few MHz) as shown in FIG. 2B. The coupling between said sensor CA and the electrochemical generator GE is for example obtained by gluing of the sensor onto a wall of said generator GE. The electrochemical generator GE can in particular have the form of a battery or of a fuel cell. More generally, the term electrochemical generator GE means a device that makes it possible to convert the chemical energy into electrical energy. In an embodiment, the electrochemical generator comprises a unit for managing and the means of calculating MC comprises means for connecting to said unit for managing in such a way as to apply an electrical signal SE to the electrochemical generator GE. In an embodiment, the device DM comprises an electrical signal generator GS, for example an arbitrary signal generator or a potentiostat, in such a way as to be able to apply an electrical signal SE to the terminals of the electrochemical generator GE. The malfunction that the device DM makes it possible to detect can have several origins. For example, the malfunction can be due to a problem on the sensor CA itself or be due to a total or partial detaching of the sensor CA resulting in a loss of coupling between the sensor CA and the electrochemical generator GE. The malfunction can also relate to a deviation in the performance of the acoustic sensor CA. The means of calculating MC can take the form of a processor associated with a memory, a FPGA or an ASIC board. The means of calculating MC can also comprise a memory for storing the instructions that allow the device DM to implement the method 100 according to a first aspect of the invention. The means of calculating MC comprises means for receiving the signals received by the acoustic sensor. In an embodiment, it also comprises means for processing the acoustic signals SA received from the acoustic sensor CA (for example, filtering or calculating an average value of a magnitude of the signal, such as the amplitude). It also comprises means for sending instructions in such a way as to control the unit for managing the electrochemical generator or the signal generator. Thus, the electrical signals can be generated by control of the means of calculating. In an embodiment, the device comprises means for key-entry, for example a keyboard, in such a way that the user can choose one or several parameters of the method 100, such as the interval of time that separates two verifications of the correct operation of the acoustic sensor CA. The device DM can also comprise a means for displaying, for example a screen, for displaying a malfunction when the latter is detected. Advantageously, the device DM comprises a touch screen that allows for key-entry and displaying.

The invention claimed is:

1. A method for detecting a malfunction of an acoustic sensor coupled to an electrochemical generator comprising:
   applying an electrical signal to the electrochemical generator at a given signal frequency and a given signal amplitude, the electrical signal applied to the electrochemical generator being superimposed on electrical signals corresponding to a normal operation of the electrochemical generator;
   measuring, by the acoustic sensor, an acoustic signal emitted by the electrochemical generator in response to the application of the electrical signal;
   when an amplitude of the acoustic signal measured by the acoustic sensor is below a predetermined threshold value, detecting a malfunction of the acoustic sensor.

2. The method according to claim 1, wherein the acoustic sensor has a resonance frequency and the signal frequency is chosen according to said resonance frequency.

3. The method according to claim 1, wherein the applying of an electrical signal and the measuring of an acoustic signal are repeated at a given detection frequency.

4. The method according to claim 1, wherein the amplitude of the acoustic signal considered is an average value of the amplitude of the acoustic signal measured over a given bandwidth.

5. The method according to claim 1, wherein the electrical signal applied has sine, square or triangular shape.

6. The method according to claim 1, further comprising, before the applying of an electrical signal, a step of calibrating during which the threshold value and the signal amplitude are determined.

7. A device comprising a means of calculating and an acoustic sensor intended to be coupled to said electrochemical generator, wherein the device is configured to implement the method for detecting according to claim 1.

8. A computer program comprising instructions which lead a device to execute the steps of the method according to claim 1.

9. A non-transitory computer readable medium readable by a computer, on which the computer program is recorded according to claim 8.

* * * * *